United States Patent
Smythe et al.

(10) Patent No.: US 7,273,796 B2
(45) Date of Patent: Sep. 25, 2007

(54) METHODS OF FORMING TRENCH ISOLATION IN THE FABRICATION OF INTEGRATED CIRCUITRY AND METHODS OF FABRICATING INTEGRATED CIRCUITRY

(75) Inventors: John Smythe, Boise, ID (US); Li Li, Meridian, ID (US); Janos Fucsko, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 240 days.

(21) Appl. No.: 11/087,218

(22) Filed: Mar. 23, 2005

(65) Prior Publication Data

US 2006/0216906 A1    Sep. 28, 2006

(51) Int. Cl.
*H01L 21/76* (2006.01)

(52) U.S. Cl. ................ 438/438; 438/435; 257/E21.546

(58) Field of Classification Search ................ 438/435, 438/438; 257/E21.546
See application file for complete search history.

(56) References Cited

U.S. PATENT DOCUMENTS 6,566,229 B2    5/2003    Hong et al.

2005/0009267 A1    1/2005    Belyansky et al.
2005/0116300 A1 *   6/2005    Hieda et al. ................ 257/374
2005/0130439 A1 *   6/2005    Goo et al. ................... 438/763
2006/0267131 A1 *  11/2006    Smythe et al. .............. 257/506

OTHER PUBLICATIONS

Kubo et al., *Formation of Silica coating films from spin-on polysilazane at room temperature and their stability in hot water*, 19 J. Mater. Res. No. 2, pp. 635-642 (Feb. 2004).

Shin et al., *Data Retention Time and Electrical Characteristics of Cell Transistor According to STI Materials in 90 nm DRAM*, 3 Journal of Semiconductor Technology and Science, No. 2, pp. 69-75 (Jun. 2003).

* cited by examiner

*Primary Examiner*—Bradley K Smith
(74) *Attorney, Agent, or Firm*—Wells St. John P.S.

(57) ABSTRACT

A method of fabricating integrated circuitry includes depositing a spin-on-dielectric over a semiconductor substrate. The spin-on-dielectric comprises a polysilazane. Only some of the polysilazane is etched from the semiconductor substrate. Such etching comprises exposure to an etching fluid comprising at least one of a) an aqueous fluid having a pH greater than 7.0, or b) a basic fluid solution. After the etching, remaining spin-on-dielectric comprising polysilazane is annealed effective to form an annealed dielectric which is different in composition from the spin-on-dielectric, and preferably having a dielectric constant k which is different from that of the initially deposited spin-on-dielectric.

67 Claims, 6 Drawing Sheets

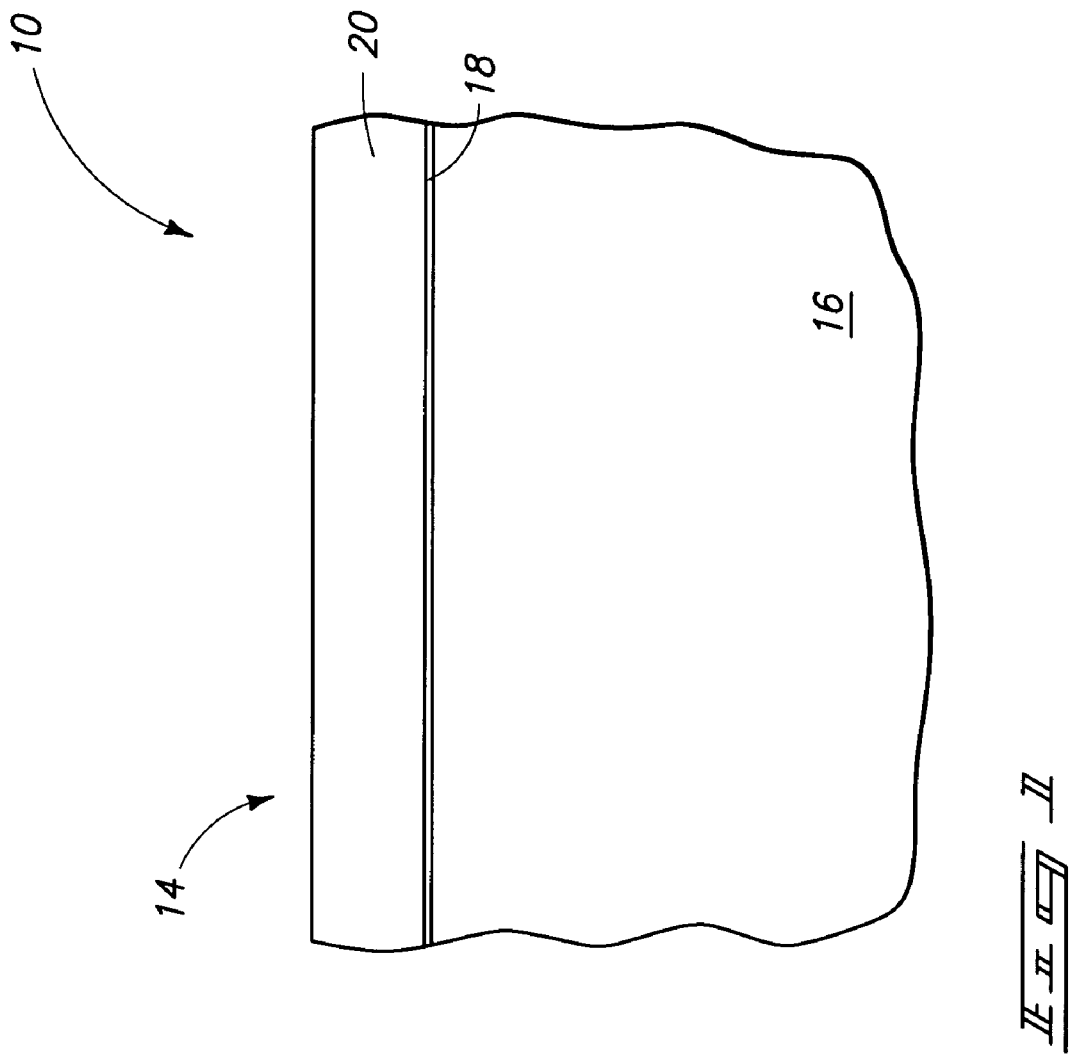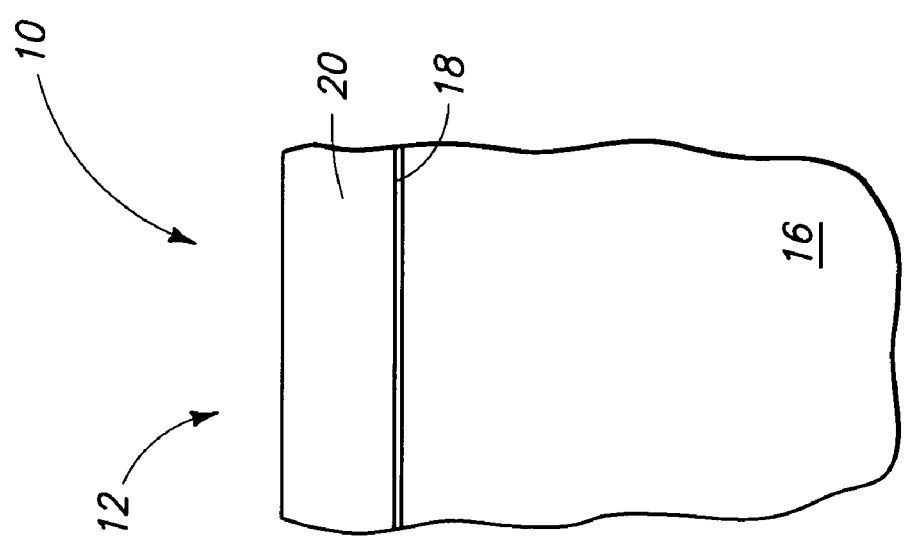

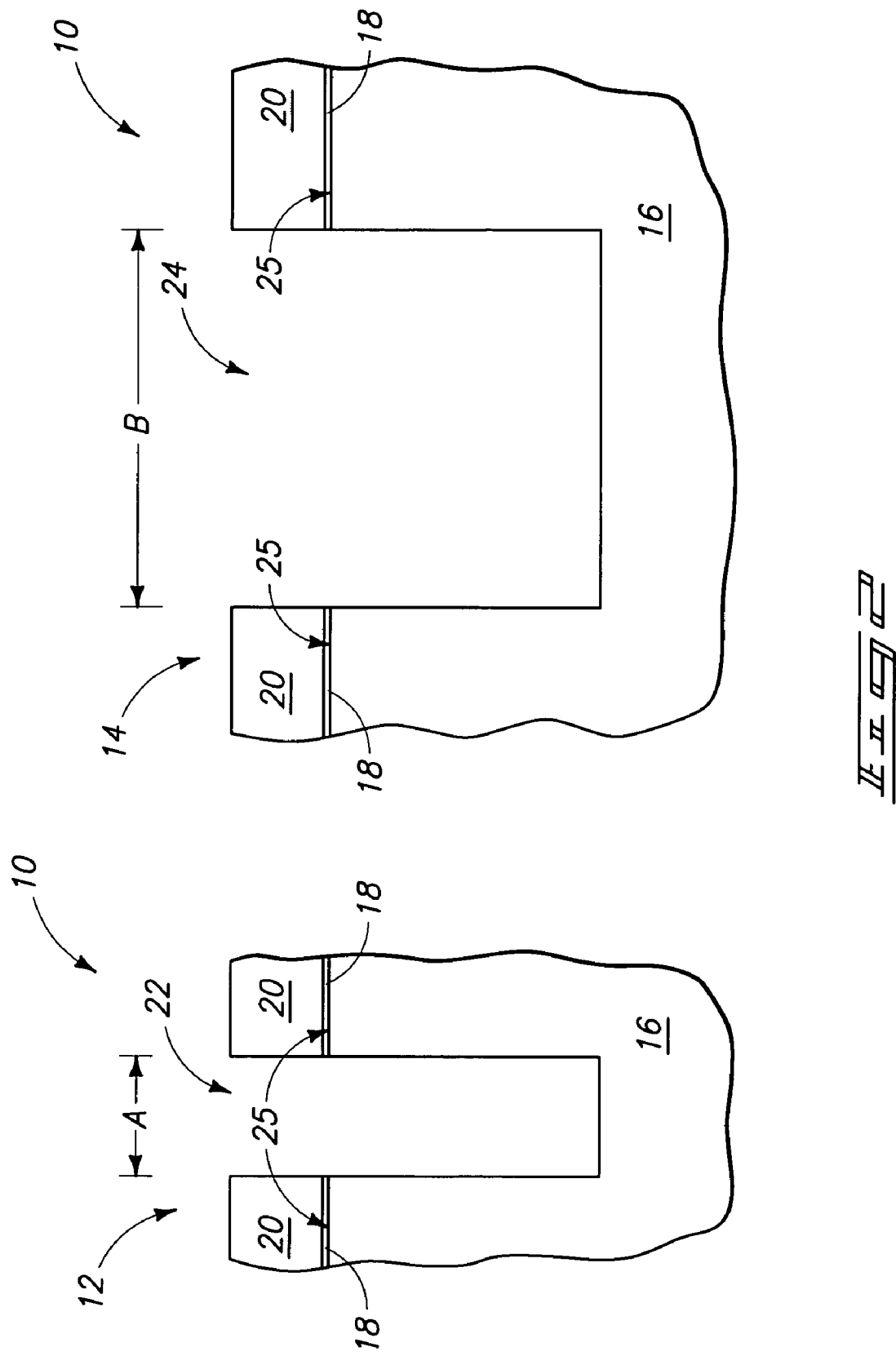

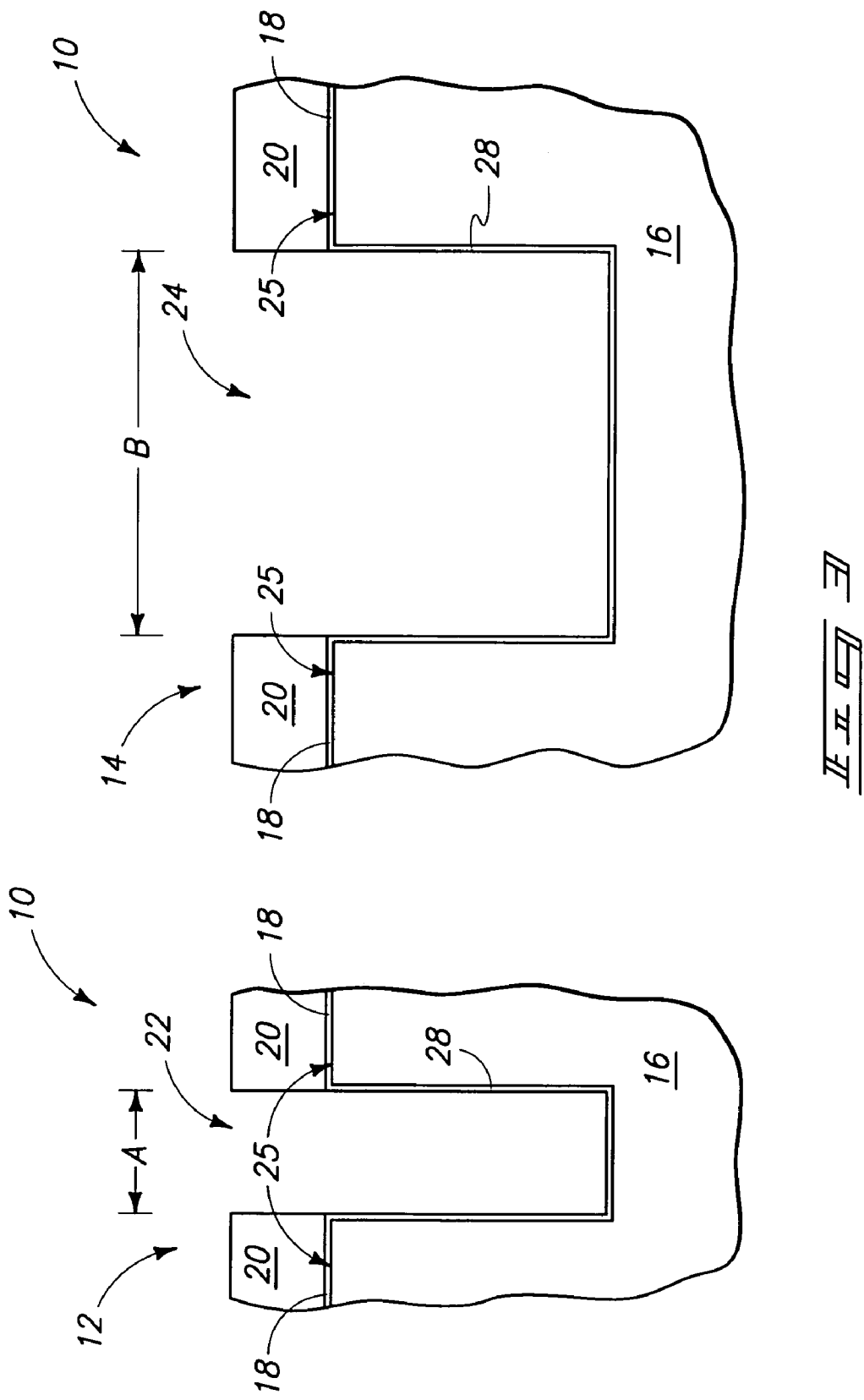

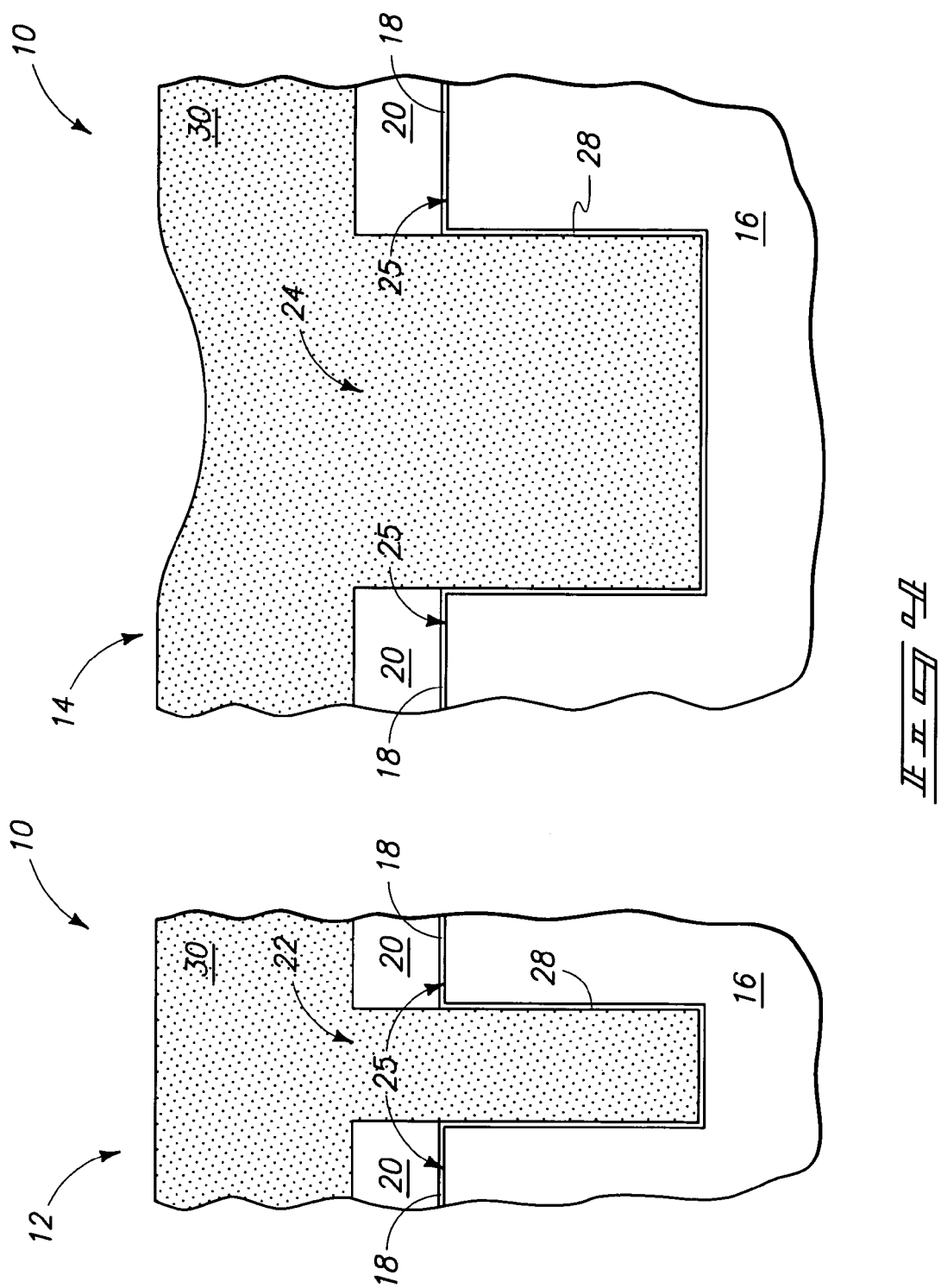

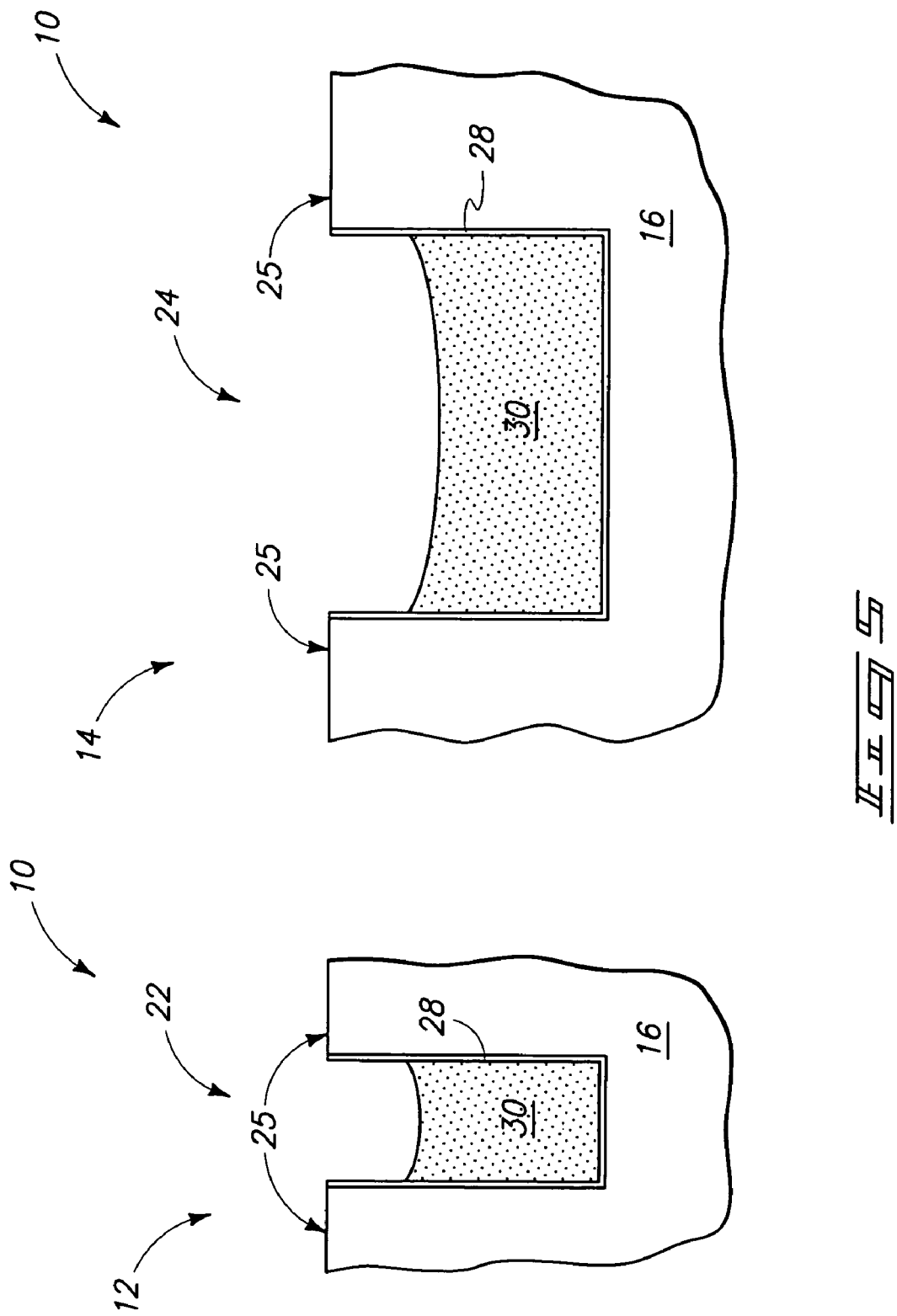

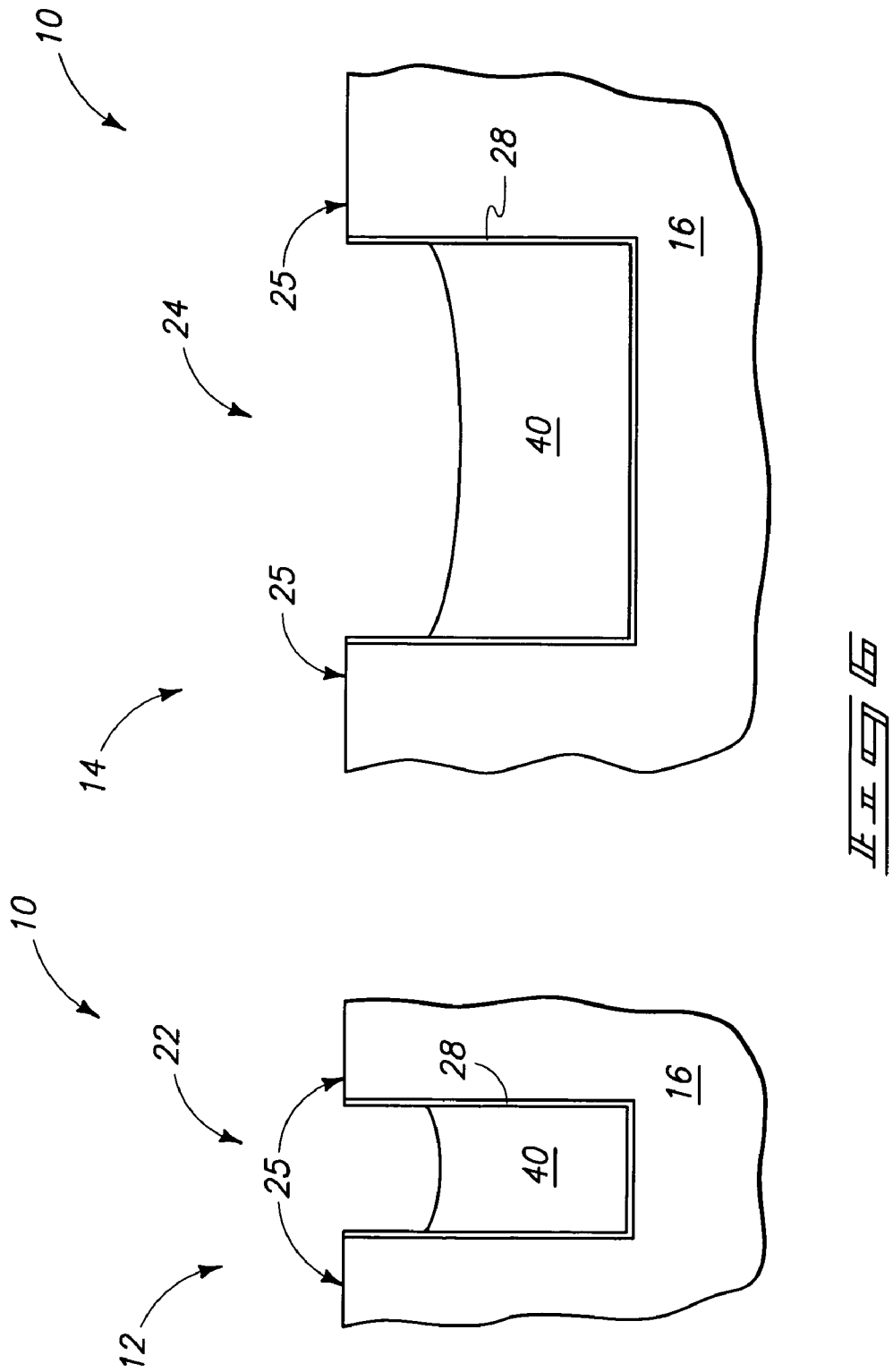

METHODS OF FORMING TRENCH ISOLATION IN THE FABRICATION OF INTEGRATED CIRCUITRY AND METHODS OF FABRICATING INTEGRATED CIRCUITRY

TECHNICAL FIELD

This invention relates to methods of forming trench isolation in the fabrication of integrated circuitry and to methods of fabricating integrated circuitry.

BACKGROUND OF THE INVENTION

In the fabrication of integrated circuitry, numerous devices are packed onto a single small area of a semiconductor substrate to create an integrated circuit. Many of the individual devices are electrically isolated from one another. Accordingly, electrical isolation is an integral part of semiconductor device design for preventing unwanted electrical coupling between adjacent components and devices.

As the size of integrated circuits is reduced, the devices that make up the circuits are positioned closer together. Conventional methods of isolating circuit components use trench isolation. Such is typically formed by etching trenches into a semiconductor substrate and filling the trenches with insulative material. As the density of components on the semiconductor substrate increased, the widths of the trenches have decreased.

Insulative materials that are commonly utilized for electrical isolation within isolation trenches include silicon dioxide and silicon nitride. For example, it is common to thermally oxidize trench sidewalls within a silicon-comprising semiconductor substrate, and provide a thin silicon nitride layer thereover. The remaining volume of the trenches is then filled with an insulative material, for example high density plasma deposited silicon dioxide. Yet as trenches have become deeper and narrower, high density plasma deposited oxides can result in undesired void formation within the trenches during filling. Alternate techniques which provide better conformal deposition within isolation trenches include spin-on-dielectrics and chemical vapor deposition utilizing ozone and tetraethylorthosilicate (TEOS). Such latter processes, while resulting in good void-free gap filling, typically result in a silicon dioxide deposition which is not as dense as desired. Accordingly, a steam anneal at very high temperatures is typically utilized to densify the deposited silicon dioxide. To preclude undesired oxide formation of underlying material, a silicon nitride oxidation barrier layer is typically employed within all of the trenches to shield underlying material from being oxidized during the steam anneal.

Further and regardless, deposition using ozone/TEOS or high density plasma oxides typically requires deposition thicknesses much greater than the depths of the trenches themselves to get adequate fill within the trenches. This of course adds to the time required to later remove such material from laterally outward of the trenches. Further even with spin-on-dielectrics, it is sometimes very difficult to get the material deep within high aspect ratio trenches to densify at the bases of such trenches. Further in some instances, it is desirable to controllably recess the trench isolation material within the isolation trenches which have been formed.

While the invention was motivated in addressing the above identified issues, it is in no way so limited. The invention is only limited by the accompanying claims as literally worded, without interpretative or other limiting reference to the specification, and in accordance with-the doctrine of equivalents.

SUMMARY

The invention includes methods of forming trench isolation in the fabrication of integrated circuitry, and methods of fabricating integrated circuitry. In one implementation, a method of fabricating integrated circuitry includes depositing a spin-on-dielectric over a semiconductor substrate. The spin-on-dielectric comprises a polysilazane. Only some of the polysilazane is etched from the semiconductor substrate. Such etching comprises exposure to an etching fluid comprising at least one of a) an aqueous fluid having a pH greater than 7.0, or b) a basic fluid solution. After the etching, remaining spin-on-dielectric comprising polysilazane is annealed effective to form an annealed dielectric which is different in composition from the spin-on-dielectric.

In one implementation, a method of forming trench isolation in the fabrication of integrated circuitry includes forming an isolation trench into semiconductive material of a semiconductor substrate. A spin-on-dielectric comprising a polysilazane is deposited to within the isolation trench. The polysilazane is etched effective to recess the spin-on-dielectric in the isolation trench relative to an outermost surface of the semiconductive material adjacent the isolation trench. The etching comprises exposure to an etching fluid comprising at least one of a) an aqueous fluid having a pH greater than 7.0, or b) a basic fluid solution. After the etching, remaining spin-on-dielectric comprising polysilazane is annealed within the isolation trench effective to form a trench isolation dielectric within the isolation trench which is different in composition from the spin-on-dielectric.

In one implementation, a method of forming trench isolation in the fabrication of integrated circuitry includes forming first and second isolation trenches into semiconductive material of a semiconductor substrate. The first isolation trench has a narrowest outermost cross sectional dimension which is less than that of the second isolation trench. A spin-on-dielectric comprising a polysilazane is deposited to within the first and second isolation trenches. The polysilazane is etched effective to recess the spin-on-dielectric in the first and second isolation trenches relative to an outermost surface of the semiconductive material adjacent the first and second isolation trenches. After the etching, remaining spin-on-dielectric comprising polysilazane is annealed within the first and second isolation trenches effective to form a trench isolation dielectric within the first and second isolation trenches which is different in composition from the spin-on-dielectric.

Other aspects and implementations are contemplated.

BRIEF DESCRIPTION OF THE DRAWINGS

Preferred embodiments of the invention are described below with reference to the following accompanying drawings.

FIG. 1 is a fragmentary diagrammatic sectional view of a substrate in process in accordance with an aspect of the invention.

FIG. 2 is a view of the FIG. 1 substrate at a processing subsequent to that shown by FIG. 1.

FIG. 3 is a view of the FIG. 2 substrate at a processing subsequent to that shown by FIG. 2.

FIG. 4 is a view of the FIG. 3 substrate at a processing subsequent to that shown by FIG. 3.

FIG. 5 is a view of the FIG. 4 substrate at a processing subsequent to that shown by FIG. 4.

FIG. 6 is a view of the FIG. 5 substrate at a processing subsequent to that shown by FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention contemplates methods of forming trench isolation in the fabrication of integrated circuitry, and to methods of fabricating integrated circuitry independent of whether trench isolation is fabricated. Referring initially to FIG. 1, a semiconductor substrate in process is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In one exemplary embodiment, FIG. 1 can be considered as depicting a first circuitry area 12 and a second circuitry area 14 of semiconductor substrate 10. Various common or different types of circuitry might be fabricated relative to the respective depicted areas. For example, and by way of example only, integrated circuitry being fabricated might comprise memory circuitry within first circuitry area 12, and with second circuitry area 14 comprising a peripheral circuitry area. In one exemplary implementation, the integrated circuitry comprises logic circuitry, with first circuitry area 12 comprising a logic circuitry area and second circuitry area 14 comprising a metal routing area.

Semiconductor substrate 10 is depicted as comprising bulk semiconductive material 16, for example lightly doped monocrystalline silicon. Of course, semiconductor-on-insulator constructions and other substrates, whether existing or yet-to-be developed, are also contemplated. A pad oxide layer 18 has been formed over semiconductive material 16, and a silicon nitride-comprising masking layer 20 has been formed over pad oxide layer 18.

Referring to FIG. 2, a first isolation trench 22 and a second isolation trench 24 have been formed into semiconductive material 16 of semiconductor substrate 10. By way of example only, an exemplary technique for forming depicted trenches 22 and 24 comprises photolithographic patterning and etch. However, any technique of forming the trenches is contemplated, and regardless of the use of a pad oxide or silicon nitride-comprising masking layer, and whether existing or yet-to-be developed. First isolation trench 22 within material 16 has a narrowest outermost cross-sectional dimension A which is less than a narrowest outermost cross-sectional dimension B of second isolation trench 24 within material 16. In one exemplary implementation, dimension A is no greater than 1,250 Angstroms, and dimension B is at least 2,000 Angstroms. Exemplary depths for trenches 22 and 24 within material 16 are from 200 Angstroms to 4,000 Angstroms. Semiconductive material 16 can be considered as having outermost surfaces 25 adjacent first and second isolation trenches 22 and 24, respectively.

Referring to FIG. 3, the material 16 sidewalls of isolation trenches 22 and 24 have been thermally oxidized to form a silicon dioxide-comprising layer 28 which lines the trenches. Such oxide layer might be formed later in the processing, or not at all. An exemplary thickness range for silicon dioxide-comprising layer 28 is from 50 Angstroms to 75 Angstroms. By way of example only, an exemplary technique for forming such layer includes furnace oxidation at 800° C., for example using $O_2$ and/or $N_2$ exposure, followed by $H_2O$ exposure, and followed again by $O_2$ and/or $N_2$ exposure.

Referring to FIG. 4, a spin-on-dielectric 30 has been deposited to within first isolation trench 22 and second isolation trench 24. The spin-on-dielectric comprises a polysilazane, with perhydropolysilazane being a specific preferred example. An exemplary preferred deposition thickness for spin-on-dielectric 30 above silicon nitride-comprising layer 20 is from 200 Angstroms to 3,000 Angstroms. Further by way of example only, pad oxide layer 18 and silicon nitride-comprising masking layer 20 might be removed prior to spin-on-dielectric 30 deposition. Regardless, spin-on-dielectric 30 is preferably solvent-baked at an exemplary temperature of 150° C. to remove solvent and solidify spin-on-dielectric 30.

In a processing problem which motivated certain aspects of the invention, it was discovered that the etch characteristics of the spin-on-dielectric material deposited within the depicted trenches manifested different etch characteristics from within the respective trenches after such spin-on-dielectric was annealed suitably to be transformed into a silicon dioxide-comprising material. Specifically, after a solvent bake, materials 30, 20 and 18 were chemical mechanical polished back to at least surfaces 25. Then, in an etchant consisting essentially of HF and $H_2O$, the spin-on-dielectric deposited in first narrower isolation trench 22, upon anneal, was discovered to have a much faster etch rate than did the spin-on-dielectric deposited in wider second isolation trench 24. Such problem particularly manifested as the dimension A approached 1,250 Angstroms and less. The particular problem identified was that exposure to such an etchant resulted in rapid, and largely uncontrollable etching of the annealed spin-on-dielectric within narrower trench 22 often to the extent of complete etch out, with much less etching of the annealed spin-on-dielectric within isolation trench 24. The same behavior was exhibited when using an etchant comprising $NH_4F$, HF and $H_2O$. The exemplary etching conditions within which such was exhibited were in an atmospheric wet etch at from 20° C. to 22° C. for a 25:1 ratio of $H_2O$ to a 49% by weight HF solution, and using alternately anywhere from 20:1 to 100:1 ratio by volume of a $NH_4F$ (40 weight percent in $H_2O$) and HF (49 weight percent in $H_2O$) solution. Accordingly, in one aspect of the invention, the spin-on-dielectric might be characterized in such manners.

Referring to FIG. 5, the polysilazane has been etched effective to recess spin-on-dielectric 30 within first isolation trench 22 and second isolation trench 24 relative to outermost surfaces 25 of semiconductive material 16 adjacent first isolation trench 22 and second isolation trench 24. In one exemplary embodiment, and as shown, spin-on-dielectric 30 might be planarize-polished initially, for example by chemical mechanical polishing, and also effective to remove silicon nitride-comprising masking layer 20 and pad oxide layer 18, following by further removal/etching of the polysilazane to recess it relative to outermost surfaces 25. Preferably, such etching is substantially selective relative to silicon, silicon dioxide, and silicon nitride. An exemplary preferred depth for the recesses relative to outermost surfaces 25 is from 500 Angstroms to 3,000 Angstroms. In one preferred implementation, the etching comprises exposure to an etching fluid comprising at least one of a) an aqueous fluid having a pH of at least 7.0, or b) a basic fluid solution. Of course, the exemplary basic fluid solution might be aqueous in one embodiment, or alternately be void of $H_2O$ in another embodiment. Regardless, in one preferred embodiment, the etching fluid has a pH of at least 7.5, in another preferred embodiment of at least 8.0, and in an even more preferred embodiment a pH from 10.0 to 13.0.

The etching fluid might comprise a liquid or a gas, and of course including a mixture of liquid and gas. Any etching pressure is contemplated, with atmospheric etching being one particular example. Where the etching fluid comprises a liquid, an exemplary preferred temperature range is from 10° C. to 90° C., a temperature range of from 10° C. to 60° C. being more preferred, and even a range of from 25° C. to 35° C. being more preferred. A specific preferred example is at 55° C. or 30° C. and atmospheric pressure and a pH of 11.5 for a single wafer spin-spray tool. An exemplary preferred etch rate is from 50 Angstroms/minute to 500 Angstroms/minute.

An exemplary preferred etching temperature, where the etching fluid comprises a gas, is from 0° C. to 150° C. Specific exemplary preferred etching fluid materials include at least one of $NH_4OH$, tetramethyl ammonium hydroxide, tetrabutyl ammonium hydroxide, sodium hydroxide or potassium hydroxide, and of course including mixtures thereof. Such specific exemplary etching fluids might be aqueous or non-aqueous. If non-aqueous, exemplary preferred additional material includes at least one of an alcohol or acetone, including mixtures thereof. Specific example includes polyols, glycols and isopropyl alcohol. Further, aqueous etching fluids comprising alcohol and/or acetone are also contemplated.

Referring to FIG. 6, the remaining spin-on-dielectric 30 from FIG. 5 has been annealed after the etching of FIG. 5 within first isolation trench 22 and second isolation trench 24. Such annealing has been effective to form a trench isolation dielectric 40 within first isolation trench 22 and second isolation trench 24 to be of different composition from the spin-on-dielectric (after any solvent bake/evaporation). In one preferred implementation, trench isolation dielectric 40 has a dielectric constant k which is different from that of the initially deposited spin-on-dielectric 30. An exemplary preferred material having a lower dielectric constant k from that of the initially deposited spin-on-dielectric is $SiO_2$. For example, perhydropolysilazane, as deposited and after solvent bake, typically has a dielectric constant k of about 4.5, while that after annealing to the $SiO_2$—comprising material 40 is about 3.9. Alternately by way of example only, the annealing might be effective to form the trench isolation dielectric 40 to have a dielectric constant k which is greater than that of the initially deposited spin-on-dielectric, for example annealing to form $Si_3N_4$ having a dielectric constant of at least 7. By way of example only, one exemplary preferred annealing utilizes $H_2$ and $O_2$ at a volumetric ratio of 1.5:1, atmospheric pressure and at a temperature of 100° C. for a time period of from 5 minutes to 2 hours. Alternate exemplary processing is also contemplated, of course, for example with exposure at other temperatures and pressures. Further alternately by way of example only, $N_2$ or other materials might be utilized in the annealing gas.

Regardless, in one preferred embodiment the semiconductor substrate is not exposed to a temperature greater than 200° C. intermediate the depositing of the spin-on-dielectric and the etching thereof to recess it relative to semiconductive material 16. Thereby in one preferred implementation, very little if any of the polysilazane-comprising material is converted to another material after solvent evaporation and prior to the stated preferred etching thereof.

The invention also contemplates a method of forming trench isolation in the fabrication of integrated circuitry independent of whether different width first and second isolation trenches are formed, for example with respect to a single trench or with respect to a plurality of trenches having the same narrowest outermost cross-sectional dimensions. For example in such a method, such comprises forming an isolation trench into semiconductive material of the semiconductor substrate. Spin-on-dielectric is deposited to within the isolation trench, with the spin-on-dielectric comprising a polysilazane. The polysilazane is etched effective to recess the spin-on-dielectric in the isolation trench relative to an outermost surface of the semiconductive material adjacent the isolation trench. Such etching comprises exposure to an etching fluid comprising at least one of a) an aqueous fluid having a pH greater than 7.0, or b) a basic fluid solution. After such etching, the remaining spin-on-dielectric-comprising polysilazane is annealed within the isolation trench effective to form a trench isolation dielectric therein which is different in composition from the spin-on-dielectric, and further preferably having a dielectric constant k which is different from that of the initially deposited spin-on-dielectric. Preferred materials, methods of forming, depositing, etching, processing parameters, etc., are otherwise preferably as described above with respect to either of isolation trenches 22 and 24 in the first-described embodiment.

Further, the invention contemplates methods of fabricating integrated circuitry independent of whether trench isolation is formed as part of such integrated circuitry. In said method, such comprises depositing a spin-on-dielectric over a semiconductive substrate, with the spin-on-dielectric comprising a polysilazane. Only some of such polysilazane is etched from the semiconductor substrate, and wherein the etching comprises exposure to an etching fluid comprising at least one of a) an aqueous fluid having a pH greater than 7.0, or b) a basic fluid solution. After such etching, the remaining spin-on-dielectric-comprising polysilazane is annealed effective to form an annealed dielectric which is different in composition from the spin-on-dielectric, and further preferably having a dielectric constant k which is different from that of the initially deposited spin-on-dielectric. Preferred methods of depositing, etching, annealing, materials, parameters, etc., are preferably as described above in connection with the first-described embodiments, and again, independent of whether isolation trenches are formed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:
1. A method of forming trench isolation in the fabrication of integrated circuitry, comprising:
   forming first and second isolation trenches into semiconductive material of a semiconductor substrate, the first isolation trench having a narrowest outermost cross sectional dimension which is less than that of the second isolation trench;

depositing a spin-on-dielectric to within the first and second isolation trenches, the spin-on-dielectric comprising a polysilazane;

etching the polysilazane effective to recess the spin-on-dielectric in the first and second isolation trenches relative to an outermost surface of the semiconductive material adjacent the first and second isolation trenches, the polysilazane not being polished prior to said etching and the polysilazane being entirely outwardly exposed within the first and second trenches during at least some of said etching; and after the etching, annealing remaining spin-on-dielectric comprising polysilazane within the first and second isolation trenches effective to form a trench isolation dielectric within the first and second isolation trenches which is different in composition from the spin-on-dielectric.

2. A method of forming trench isolation in the fabrication of integrated circuitry, comprising:

forming first and second isolation trenches into semiconductive material of a semiconductor substrate, the first isolation trench having a narrowest outermost cross sectional dimension which is less than that of the second isolation trench;

depositing a spin-on-dielectric to within the first and second isolation trenches, the spin-on-dielectric comprising a polysilazane;

polishing the polysilazane and then etching the polysilazane effective to recess the spin-on-dielectric in the first and second isolation trenches relative to an outermost surface of the semiconductive material adjacent the first and second isolation trenches; and after the etching, annealing remaining spin-on-dielectric comprising polysilazane within the first and second isolation trenches effective to form a trench isolation dielectric within the first and second isolation trenches which is different in composition from the spin-on-dielectric.

3. The method of claim 2 wherein the polishing comprises chemical mechanical polishing.

4. The method of claim 2 wherein the etching comprises exposure to an etching fluid comprising at least one of a) an aqueous fluid having a pH of at least 7.0, or b) a basic fluid solution.

5. A method of forming trench isolation in the fabrication of integrated circuitry, comprising:

forming first and second isolation trenches into semiconductive material of a semiconductor substrate, the first isolation trench having a narrowest outermost cross sectional dimension which is less than that of the second isolation trench;

depositing a spin-on-dielectric to within the first and second isolation trenches, the spin-on-dielectric comprising a polysilazane;

etching the polysilazane effective to recess the spin-on-dielectric in the first and second isolation trenches relative to an outermost surface of the semiconductive material adjacent the first and second isolation trenches, the etching comprising exposure to an etching fluid comprising at least one of a) an aqueous fluid having a pH of at least 7.0, or b) a basic fluid solution; and after the etching, annealing remaining spin-on-dielectric comprising polysilazane within the first and second isolation trenches effective to form a trench isolation dielectric within the first and second isolation trenches which is different in composition from the spin-on-dielectric.

6. The method of claim 5 wherein the etching fluid comprises an aqueous fluid having a pH of at least 7.0.

7. The method of claim 5 wherein the etching fluid comprises a basic fluid solution.

8. The method of claim 7 wherein the etching fluid is void of $H_2O$.

9. The method of claim 5 wherein the etching fluid has a pH of at least 7.5.

10. The method of claim 9 wherein the etching fluid has a pH of at least 8.0.

11. The method of claim 10 wherein the etching fluid has a pH from 10.0 to 13.0.

12. The method of claim 5 wherein the etching fluid comprises a liquid.

13. The method of claim 12 wherein the etching occurs at a temperature from 10° C. to 90° C.

14. The method of claim 13 wherein the etching occurs at a temperature from 10° C. to 60° C.

15. The method of claim 14 wherein the etching occurs at a temperature from 25° C. to 35° C.

16. The method of claim 5 wherein the etching fluid comprises a gas.

17. The method of claim 16 wherein the etching occurs at a temperature from 0° C. to 150° C.

18. The method of claim 5 wherein the etching fluid comprises at least one of $NH_4OH$, tetramethyl ammonium hydroxide, tetrabutyl ammonium hydroxide, sodium hydroxide, or potassium hydroxide, including mixtures thereof.

19. The method of claim 18 wherein the etching fluid comprises an aqueous fluid having a pH of at least 7.0.

20. The method of claim 18 wherein the etching fluid comprises at least one of an alcohol or acetone, including mixtures thereof.

21. The method of claim 20 wherein the etching fluid is void of $H_2O$.

22. The method of claim 20 wherein the etching fluid comprises $H_2O$.

23. A method of forming trench isolation in the fabrication of integrated circuitry, comprising:

forming first and second isolation trenches into semiconductive material of a semiconductor substrate, the first isolation trench having a narrowest outermost cross sectional dimension which is less than that of the second isolation trench, the first isolation trench having a narrowest outermost cross sectional dimension of no greater that 1,250 Angstroms, and the second isolation trench has a narrowest outermost cross sectional dimension of at least 2,000 Angstroms;

depositing a spin-on-dielectric to within the first and second isolation trenches, the spin-on-dielectric comprising a polysilazane;

etching the polysilazane effective to recess the spin-on-dielectric in the first and second isolation trenches relative to an outermost surface of the semiconductive material adjacent the first and second isolation trenches; and after the etching, annealing remaining spin-on-dielectric comprising polysilazane within the first and second isolation trenches effective to form a trench isolation dielectric within the first and second isolation trenches which is different in composition from the spin-on-dielectric.

24. A method of forming trench isolation in the fabrication of integrated circuitry, comprising:
    forming first and second isolation trenches into semiconductive material of a semiconductor substrate, the first isolation trench having a narrowest outermost cross sectional dimension which is less than that of the second isolation trench;
    depositing a spin-on-dielectric to within the first and second isolation trenches, the spin-on-dielectric comprising perhydropolysilazane;
    etching the polysilazane effective to recess the spin-on-dielectric in the first and second isolation trenches relative to an outermost surface of the semiconductive material adjacent the first and second isolation trenches; and
    after the etching, annealing remaining spin-on-dielectric comprising polysilazane within the first and second isolation trenches effective to form a trench isolation dielectric within the first and second isolation trenches which is different in composition from the spin-on-dielectric.

25. A method of forming trench isolation in the fabrication of integrated circuitry, comprising:
    forming first and second isolation trenches into semiconductive material of a semiconductor substrate, the first isolation trench having a narrowest outermost cross sectional dimension which is less than that of the second isolation trench;
    depositing a spin-on-dielectric to within the first and second isolation trenches, the spin-on-dielectric comprising a polysilazane;
    etching the polysilazane effective to recess the spin-on-dielectric in the first and second isolation trenches relative to an outermost surface of the semiconductive material adjacent the first and second isolation trenches, the etching being effective to recess the spin-on-dielectric from 500 Angstroms to 3,000 Angstroms from the outermost surface of the semiconductive material adjacent the first and second isolation trenches; and
    after the etching, annealing remaining spin-on-dielectric comprising polysilazane within the first and second isolation trenches effective to form a trench isolation dielectric within the first and second isolation trenches which is different in composition from the spin-on-dielectric.

26. A method of forming trench isolation in the fabrication of integrated circuitry, comprising:
    forming first and second isolation trenches into semiconductive material of a semiconductor substrate, the first isolation trench having a narrowest outermost cross sectional dimension which is less than that of the second isolation trench;
    depositing a spin-on-dielectric to within the first and second isolation trenches, the spin-on-dielectric comprising a polysilazane;
    etching the polysilazane effective to recess the spin-on-dielectric in the first and second isolation trenches relative to an outermost surface of the semiconductive material adjacent the first and second isolation trenches; and
    after the etching, annealing remaining spin-on-dielectric comprising polysilazane within the first and second isolation trenches effective to form a trench isolation dielectric within the first and second isolation trenches which is different in composition from the spin-on-dielectric, the annealing is being effective to form the trench isolation dielectric to have a dielectric constant k which is less than that of the initially deposited spin-on-dielectric.

27. The method of claim 26 wherein the trench isolation dielectric comprises $SiO_2$.

28. A method of forming trench isolation in the fabrication of integrated circuitry, comprising:
    forming first and second isolation trenches into semiconductive material of a semiconductor substrate, the first isolation trench having a narrowest outermost cross sectional dimension which is less than that of the second isolation trench;
    depositing a spin-on-dielectric to within the first and second isolation trenches, the spin-on-dielectric comprising a polysilazane;
    etching the polysilazane effective to recess the spin-on-dielectric in the first and second isolation trenches relative to an outermost, surface of the semiconductive material adjacent the first and second isolation trenches; and
    after the etching, annealing remaining spin-on-dielectric comprising polysilazane within the first and second isolation trenches effective to form a trench isolation dielectric within the first and second isolation trenches which is different in composition from the spin-on-dielectric, the annealing is being effective to form the trench isolation dielectric to have a dielectric constant k which is greater than that of the initially deposited spin-on-dielectric.

29. A method of forming trench isolation in the fabrication of integrated circuitry, comprising:
    forming first and second isolation trenches into semiconductive material of a semiconductor substrate, the first isolation trench having a narrowest outermost cross sectional dimension which is less than that of the second isolation trench;
    depositing a spin-on-dielectric to within the first and second isolation trenches, the spin-on-dielectric comprising a polysilazane;
    etching the polysilazane effective to recess the spin-on-dielectric in the first and second isolation trenches relative to an outermost surface of the semiconductive material adjacent the first and second isolation trenches, the semiconductor substrate not being exposed to a temperature greater than 200° C. intermediate the depositing and the etching; and
    after the etching, annealing remaining spin-on-dielectric comprising polysilazane within the first and second isolation trenches effective to form a trench isolation dielectric within the first and second isolation trenches which is different in composition from the spin-on-dielectric.

30. A method of forming trench isolation in the fabrication of integrated circuitry, comprising:
    forming an isolation trench into semiconductive material of a semiconductor substrate;
    depositing a spin-on-dielectric to within the isolation trench, the spin-on-dielectric comprising a polysilazane;
    etching the polysilazane effective to recess the spin-on-dielectric in the isolation trench relative to an outermost surface of the semiconductive material adjacent the isolation trench, the etching comprising exposure to an etching fluid comprising at least one of a) an aqueous fluid having a pH greater than 7.0, or b) a basic fluid solution; and after the etching, annealing remaining spin-on-dielectric comprising polysilazane within the isolation trench effective to form a trench isolation dielectric within the isolation trench which is different in composition from the spin-on-dielectric.

31. The method of claim 30 wherein the polysilazane comprises perhydropolysilazane.

32. The method of claim 30 wherein the annealing is effective to form the trench isolation dielectric to have a dielectric constant k which is less than that of the initially deposited spin-on-dielectric.

33. The method of claim 30 wherein the annealing is effective to form the trench isolation dielectric to have a dielectric constant k which greater than that of the initially deposited spin-on-dielectric.

34. The method of claim 30 wherein the etching fluid comprises an aqueous fluid having a pH greater than 7.0.

35. The method of claim 30 wherein the etching fluid comprises a basic fluid solution.

36. The method of claim 35 wherein the etching fluid is void of $H_2O$.

37. The method of claim 30 wherein the etching fluid has a pH of at least 7.5.

38. The method of claim 37 wherein the etching fluid has a pH of at least 8.0.

39. The method of claim 38 wherein the etching fluid has a pH from 10.0 to 13.0.

40. The method of claim 30 wherein the etching fluid comprises a liquid.

41. The method of claim 30 wherein the etching fluid comprises a gas.

42. The method of claim 30 wherein the etching fluid comprises at least one of $NH_4OH$, tetramethyl ammonium hydroxide, tetrabutyl ammonium hydroxide, sodium hydroxide, or potassium hydroxide, including mixtures thereof.

43. The method of claim 42 wherein the etching fluid comprises an aqueous fluid having a pH of greater than 7.0.

44. The method of claim 42 wherein the etching fluid comprises at least one of an alcohol or acetone, including mixtures thereof.

45. The method of claim 44 wherein the etching fluid is void of $H_2O$.

46. The method of claim 44 wherein the etching fluid comprises $H_2O$.

47. The method of claim 30 wherein the etching is effective to recess the spin-on-dielectric from 500 Angstroms to 3,000 Angstroms from the outermost surface of the semiconductive material adjacent the isolation trench.

48. The method of claim 30 wherein the semiconductor substrate is not exposed to a temperature greater than 200° C. intermediate the depositing and the etching.

49. The method of claim 30 comprising polishing the polysilazane prior to said etching.

50. A method of fabricating integrated circuitry, comprising:

depositing a spin-on-dielectric over a semiconductor substrate, the spin-on-dielectric comprising a polysilazane;

etching only some of the polysilazane from the semiconductor substrate, the etching comprising exposure to an etching fluid comprising at least one of a) an aqueous fluid having a pH greater than 7.0, or b) a basic fluid solution; and after the etching, annealing remaining spin-on-dielectric comprising polysilazane effective to form an annealed dielectric which is different in composition from the spin-on-dielectric.

51. The method of claim 50 wherein the polysilazane comprises perhydropolysilazane.

52. The method of claim 50 wherein the annealing is effective to form the trench isolation dielectric to have a dielectric constant k which is less than that of the initially deposited spin-on-dielectric.

53. The method of claim 50 wherein the annealing is effective to form the annealed dielectric to have a dielectric constant k which greater than that of the initially deposited spin-on-dielectric.

54. The method of claim 50 wherein the etching fluid comprises an aqueous fluid having a pH greater than 7.0.

55. The method of claim 50 wherein the etching fluid comprises a basic fluid solution.

56. The method of claim 55 wherein the etching fluid is void of $H_2O$.

57. The method of claim 50 wherein the etching fluid has a pH of at least 7.5.

58. The method of claim 57 wherein the etching fluid has a pH from 10.0 to 13.0.

59. The method of claim 50 wherein the etching fluid comprises a liquid.

60. The method of claim 50 wherein the etching fluid comprises a gas.

61. The method of claim 50 wherein the etching fluid comprises at least one of $NH_4OH$, tetramethyl ammonium hydroxide, tetrabutyl ammonium hydroxide, sodium hydroxide, or potassium hydroxide, including mixtures thereof.

62. The method of claim 61 wherein the etching fluid comprises an aqueous fluid having a pH of greater than 7.0.

63. The method of claim 61 wherein the etching fluid comprises at least one of an alcohol or acetone, including mixtures thereof.

64. The method of claim 63 wherein the etching fluid is void of $H_2O$.

65. The method of claim 63 wherein the etching fluid comprises $H_2O$.

66. The method of claim 50 wherein the semiconductor substrate is not exposed to a temperature greater than 200° C. intermediate the depositing and the etching.

67. The method of claim 50 comprising polishing the polysilazane prior to said etching.

* * * * *

UNITED STATES PATENT AND TRADEMARK OFFICE
CERTIFICATE OF CORRECTION

PATENT NO. : 7,273,796 B2 Page 1 of 1
APPLICATION NO. : 11/087218
DATED : September 25, 2007
INVENTOR(S) : Smythe et al.

It is certified that error appears in the above-identified patent and that said Letters Patent is hereby corrected as shown below:

In column 9, line 67, in Claim 26, after "annealing" delete "is".

In column 10, line 18, in Claim 28, after "outermost" delete ",".

In column 10, line 26, in Claim 28, after "annealing" delete "is".

Signed and Sealed this

Eleventh Day of December, 2007

JON W. DUDAS
*Director of the United States Patent and Trademark Office*